United States Patent
Wang et al.

(10) Patent No.: US 7,447,082 B2
(45) Date of Patent: Nov. 4, 2008

(54) METHOD FOR OPERATING SINGLE-POLY NON-VOLATILE MEMORY DEVICE

(75) Inventors: Shih-Chen Wang, Taipei (TW);
Hsin-Ming Chen, Tainan Hsien (TW);
Chun-Hung Lu, Yun-Lin County (TW);
Ming-Chou Ho, Hsin-Chu (TW);
Shih-Jye Shen, Hsin-Chu (TW);
Ching-Hsiang Hsu, Hsin-Chu (TW)

(73) Assignee: eMemory Technology Inc., Science Park, Hsinchu (TW)

( * ) Notice: Subject to any disclaimer, the term of this patent is extended or adjusted under 35 U.S.C. 154(b) by 3 days.

(21) Appl. No.: 11/555,676

(22) Filed: Nov. 1, 2006

(65) Prior Publication Data
US 2007/0109861 A1    May 17, 2007

Related U.S. Application Data

(60) Provisional application No. 60/743,630, filed on Mar. 22, 2006, provisional application No. 60/597,210, filed on Nov. 17, 2005.

(51) Int. Cl.
*G11C 16/04* (2006.01)
(52) U.S. Cl. ............... 365/185.28; 365/185.15
(58) Field of Classification Search ............ 365/185.15, 365/185.28
See application file for complete search history.

(56) References Cited

U.S. PATENT DOCUMENTS

| | | | |
|---|---|---|---|
| 5,216,268 A | 6/1993 | Chen | |
| 5,761,126 A | 6/1998 | Chi et al. | |
| 6,025,625 A | 2/2000 | Chi | |
| 6,914,813 B2 | 7/2005 | Chevallier | |
| 6,920,067 B2 | 7/2005 | Hsu | |
| 6,930,002 B1 | 8/2005 | Chen et al. | |
| 6,972,997 B2 | 12/2005 | Ishimaru | |
| 6,982,906 B2 * | 1/2006 | Matsuoka et al. | 365/185.19 |
| 2002/0153555 A1 * | 10/2002 | Manabe et al. | 257/317 |
| 2006/0289925 A1 | 12/2006 | Wong | |

* cited by examiner

*Primary Examiner*—Hoai V Ho
(74) *Attorney, Agent, or Firm*—Winston Hsu

(57) ABSTRACT

A single-poly non-volatile memory cell that is fully compatible with nano-scale semiconductor manufacturing process is provided. The single-poly non-volatile memory cell includes an ion well, a gate formed on the ion well, a gate dielectric layer between the gate and the ion well, a dielectric stack layer on sidewalls of the gate, a source doping region and a drain doping region. The dielectric stack layer includes a first oxide layer deposited on the sidewalls of the gate and extends to the ion well, and a silicon nitride layer formed on the first oxide layer. The silicon nitride layer functions as a charge-trapping layer.

8 Claims, 10 Drawing Sheets

METHOD FOR OPERATING SINGLE-POLY NON-VOLATILE MEMORY DEVICE

CROSS REFERENCE TO RELATED APPLICATIONS

This application claims the benefit of U.S. provisional application No. 60/597,210 filed Nov. 17, 2005 and U.S. provisional application No. 60/743,630 filed Mar. 22, 2006.

BACKGROUND OF THE INVENTION

1. Field of the Invention

The present invention relates to a method of operation for a non-volatile memory device. In particular, the present invention relates to double-channel single-poly non-volatile memory devices with gate channels and spacer channels and a method to change the threshold voltage of the spacer channels, wherein the single-poly non-volatile memory device has an asymmetric lightly doped drain (LDD) region.

2. Description of the Prior Art

Currently, non-volatile memory is one of the most popular electronic storage media for saving information. One of the most important features of all is that the information stored in the non-volatile memory will not disappear once the power supply is cut off. Generically speaking, memory devices such as hard drives, erasable programmable read-only memory (EPROM), electrically erasable programmable read-only memory (EEPROM) and flash memory are non-volatile memory devices, because all information is still available in the absence of power supply.

According to the programming times limit, non-volatile memory devices are divided into multi-time programmable memory (MTP) and one-time programmable memory (OTP). MTP is multi-readable and multi-writable. For example, EEPROM and flash memory are designedly equipped with some corresponding electric circuits to support different operations such as programming, erasing and reading. Because OTP is one-time programmable only, it functions perfectly with electric circuits with mere programming and reading functions. Electric circuits for erasing operation are not required. Therefore, the electric circuits for OTP are much simpler than those for the MTP to minimize the production procedures and cost.

To enhance the applicability of OTP, the information stored in the OTP can be erased by the methods similar to those (such as UV light radiation) of EPROM. It is also suggested that OTP can be controlled to provide several times of reading and programming operations by simple circuit design.

Multi-time programmable memory units and one-time programmable memory units share similar stacking structures. Structurally speaking, they are divided into double-poly non-volatile memory and single-poly non-volatile memory. In the double-poly non-volatile memory, it usually comprises a floating gate for the storage of charges, an insulation layer (an ONO composite layer of silicon oxide/silicon nitride/silicon oxide for example), and a control gate for controlling the access of data. The operation of the memory unit is based on the principle of electric capacity, i.e. induced charges are stored in the floating gate to change the threshold voltage of the memory unit for determining the data status of "0" and "1."

On the other hand, in the advanced logic process, the embedding of double-poly non-volatile memory will greatly increase the cost and changes the electrical characteristics of devices because of additional thermal budget, followed by re-adjusting the characteristics of the devices back to origin device targets, so the schedule will be inevitably delayed. Consequently, single-poly non-volatile memory is advantageous and would be regarded as the embedded non-volatile memory of good competitiveness of the next generation.

Because the single-poly non-volatile memory is compatible with regular CMOS process, it is usually applied in the field of embedded memory, embedded non-volatile memory in the mixed-mode circuits and micro-controllers for example.

Please refer to U.S. Pat. No. 5,761,126 "SINGLE POLY EPROM CELL THAT UTILIZES A REDUCED PROGRAMMING VOLTAGE TO PROGRAM THE CELL", U.S. Pat. No. 6,930,002 "METHOD FOR PROGRAMMING SINGLE-POLY EPROM AT LOW OPERATION VOLTAGES", and U.S. Pat. No. 6,025,625 "SINGLE-POLY EEPROM CELL STRUCTURE OPERATIONS AND ARRAY ARCHITECTURE" for prior art regarding single-poly non-volatile memory.

The conventional single-poly non-volatile memory still has a lot of disadvantages that need improvement. First, the conventional single-poly non-volatile memory takes more wafer area. So far, no desirous solution is proposed for further miniaturizing the size of the single-poly one-time programmable memory with respect to the semiconductor logic process of 90 nm or less.

During the miniaturization of the logic process, all operational voltages and the thickness of the gate oxide decrease as well. Take the 90 nm technology for example, the thickest oxide layer is about 50 to 60 Å. It is a great challenge for the use of floating gate technique to produce multi-time programmable single-poly non-volatile memory for the reason that the insufficient tunnel oxide thickness deteriorates long term charge retention. On the other hand, it is not compatible with the current logic process to increase the thickness of the oxide layer.

Moreover, it requires higher voltage, at least 8 to 10 volts of couple well voltage for example, for the conventional single-poly non-volatile memory to generate enough electric field between the tunnel oxide layers for programming. Because the required operational voltage is much higher than the $V_{CC}$ voltage (for example 3.3V $V_{CC}$ supply voltage for input/output circuits) supplied, it results in the serious problem of reliability for the gate oxide layers of tens of Å in the more advanced nano-process. In addition, it also requires additional high voltage elements and corresponding electric circuits to generate the desired higher voltage.

Hence, a question of the next generation is how to lower the operation voltage and avoid using the oxide layers in the logic process as much as possible. The present invention is focused on this subject and makes it easier to be embedded in the logic process of the next generation.

SUMMARY OF THE INVENTION

It is one aspect of the present invention to provide a double-channel single-poly erasable and programmable read-only memory device and a method of low voltage operation for its programming, reading and erasing operations to solve the problems addressed above.

The present invention provides a method for programming a single-poly non-volatile memory unit. The single-poly non-volatile memory unit comprises an ion well of a first conductivity type, a source doping region of a second conductivity type, a drain doping region of the second conductivity type and a channel region between the source doping region and the drain doping region, wherein the channel region is divided into a first channel region and a second channel region connected to the first channel region with the same polarity, and the first channel region has a threshold voltage (Vth), a gate dielectric layer disposed directly above the first channel region, a control gate stacked on the gate dielectric layer, a dielectric spacer on the sidewall of the control gate and directly above the second channel region, wherein the spacer comprises a floating charge trapping medium; and a lightly doped drain (LDD) region of the second conductivity type between the control gate and the source doping region, the method comprising:

connecting the ion well to a well voltage ($V_B$);

electrically connecting the drain doping region to a drain voltage ($V_D$) to form a reverse bias at a junction between the drain doping region and the ion well;

electrically connecting the source doping region to a source voltage ($V_S$); and electrically connecting the control gate to a gate voltage ($V_G$) to render the first channel in an open and strong inversion state, wherein carriers are drawn into the first channel from the source doping region to generate channel hot electrons (CHEs) due to ion impact ionization and the hot electrons are re-directed, injected and trapped in the charge trapping medium due to a vertical electric field generated by the gate voltage ($V_G$).

According to another preferred embodiment, the present invention provides a method for programming a single-poly P channel non-volatile memory unit. The single-poly P channel non-volatile memory unit comprises an N type well, a P type source doping region, a P type drain doping region and a P channel between the P type source doping region and the P type drain doping region, wherein the P channel region is divided into a first channel and a second channel connected to the first channel with the same polarity, a gate dielectric layer disposed directly above the first channel, a control gate stacked on the gate dielectric layer, a dielectric spacer on the sidewall of the control gate and directly above the second channel, wherein the spacer comprises a floating charge trapping medium; and a P type lightly doped drain (PLDD) region between the control gate and the P type source doping region, the method comprising:

connecting the N type well to an N type well voltage ($V_B$);

floating the source doping region;

electrically connecting the drain doping region to a drain voltage ($V_D$) which is negative relative to the N type well voltage ($V_B$); and electrically connecting the control gate to a gate voltage ($V_G$) which is positive relative to the N type well voltage $V_B$ to render the first channel in a closed state to generate band-to-band tunneling induced hot electrons (BBHEs) to render the hot electrons injected and trapped in the charge trapping medium.

The present invention provides a method for erasing a single-poly non-volatile memory unit. The single-poly non-volatile memory unit comprises an ion well of a first conductivity type, a source doping region of a second conductivity type, a drain doping region of the second conductivity type and a channel region between the source doping region and the drain doping region, wherein the channel region is divided into a first channel region and a second channel region connected to the first channel region with the same polarity, and the first channel region has a threshold voltage ($V_{th}$); a gate dielectric layer disposed directly above the first channel region, a control gate stacked on the gate dielectric layer, a dielectric spacer on the sidewall of the control gate and directly above the second channel region, wherein the spacer comprises a floating charge trapping medium; and a lightly doped drain region of the second conductivity type between the control gate and the source doping region; electrons are stored in the floating charge trapping medium between the control gate and the drain doping region; the method comprising:

electrically connecting the ion well to a well voltage ($V_B$);

electrically connecting the source doping region to a source voltage ($V_S$);

electrically connecting the drain doping region to a drain voltage ($V_D$) to form a reverse bias at a junction between the drain and the ion well; and electrically connecting the control gate to a gate voltage ($V_G$) to render the first channel in a slightly turned-on state, wherein carriers are drawn into the first channel from the source doping region and impacted by the drain avalanche caused by the reverse bias between the drain and the ion well to render the electrons trapped in the charge trapping medium neutralized by the injection of hot holes generated by drain avalanche hot holes (DAHHs) mechanism to complete erasing.

According to another preferred embodiment, the present invention provides a method for erasing a single-poly non-volatile memory unit. The single-poly non-volatile memory unit comprises an ion well of a first conductivity type, a source doping region of a second conductivity type, a drain doping region of a second conductivity type and a channel region between the source doping region and the drain doping region, wherein the channel region is divided into a first channel region and a second channel region connected to the first channel region with the same polarity; a gate dielectric layer disposed directly above the first channel region; a control gate stacked on the gate dielectric layer; a dielectric spacer on the sidewall of the control gate and directly above the second channel region, wherein the spacer comprises a floating charge trapping medium; and a lightly doped drain region of the second conductivity type between the control gate and the source doping region; electrons are stored in the floating charge trapping medium between the control gate and the drain doping region; the method comprising:

electrically connecting the ion well to a well voltage ($V_B$);

floating the source doping region ($V_S$=floating);

electrically connecting the drain doping region to a voltage ($V_D$) which is positive relative to the well voltage $V_B$; and electrically connecting the control gate to a gate voltage ($V_G$) which is negative relative to the well voltage $V_B$ to close the first channel to render the electrons trapped in the charge trapping medium neutralized by the injection of hot electric holes generated by band-to-band induced hot hole injection (BBHH) to complete erasing.

According to another preferred embodiment, the present invention provides a method for erasing a single-poly non-volatile memory unit. The single-poly non-volatile memory unit comprises an ion well of a first conductivity type, a source doping region of a second conductivity type, a drain doping region of the second conductivity type and a channel region between the source doping region and the drain doping region, wherein the channel region is divided into a first channel region and a second channel region connected to the first channel region with the same polarity; a gate dielectric layer disposed directly above the first channel region; a control gate stacked on the gate dielectric layer; a dielectric spacer on the sidewall of the control gate and directly above the second channel region, wherein the spacer comprises a floating charge trapping medium; and a lightly doped drain region of the second conductivity type between the control gate and the source doping region; electrons are stored in the floating charge trapping medium between the control gate and the drain doping region; the method comprising:

electrically connecting the ion well to a well voltage ($V_B$);

floating the source doping region ($V_S$=floating);

electrically connecting the drain doping region to a drain voltage ($V_D$) without forming a forward bias at a junction between the drain and the ion well; and electrically connecting the control gate to a gate voltage ($V_G$) which is the reverse polarity of the drain voltage ($V_D$) to render electrons trapped in the charge trapping medium to complete erasing operation by Fowler-Nordheim tunneling (FN tunneling).

The present invention provides a method for reading a single-poly non-volatile memory unit. The single-poly non-volatile memory unit comprises an ion well of a first conductivity type, a source doping region of a second conductivity type, a drain doping region of the second conductivity type and a channel region between the source doping region and the drain doping region, wherein the channel region is divided into a first channel region and a second channel region connected to the first channel region with the same polarity; a gate dielectric layer disposed right above the first channel region; a control gate stacked on the gate dielectric layer; a dielectric spacer on the sidewall of the control gate and directly above the second channel region, wherein the spacer comprises a floating charge trapping medium; and a lightly doped drain region of second conductivity type between the control gate and the source doping region; electrons are capable of being stored in the floating charge trapping medium between the control gate and the drain doping region; the method comprising:

electrically connecting the ion well to a well voltage ($V_B$);

electrically connecting the drain doping region to a drain voltage ($V_D$);

electrically connecting the source doping region to a source voltage ($V_S$) of the same polarity as the drain voltage's, wherein the absolute value of the source voltage is greater than the drain voltage's; and electrically connecting the control gate to a gate voltage ($V_G$), wherein the application of the gate voltage is capable of rendering the first channel region in a turned-on state.

The present invention provides a method for reading a single-poly non-volatile memory unit. The single-poly non-volatile memory unit comprises an ion well of a first conductivity type, a source doping region of a second conductivity type, a drain doping region of the second conductivity type and a channel region between the source doping region and the drain doping region, wherein the channel region is divided into a first channel region and a second channel region connected to the first channel region with the same polarity; a gate dielectric layer disposed directly above the first channel region; a control gate stacked on the gate dielectric layer; a dielectric spacer on the sidewall of the control gate and directly above the second channel region, wherein the spacer comprises a floating charge trapping medium; and a lightly doped drain region of the second conductivity type between the control gate and the source doping region; electrons are capable of being stored in the floating charge trapping medium between the control gate and the drain doping region; the method comprising:

electrically connecting the ion well to a well voltage ($V_B$);

electrically connecting the drain doping region to a drain voltage ($V_D$);

electrically connecting the source doping region to a source voltage ($V_S$) of the same polarity as the drain voltage's, wherein the absolute value of the source voltage is smaller than the drain voltage's; and electrically connecting the control gate to a gate voltage ($V_G$), wherein the application of the gate voltage is capable of rendering the first channel region in a turned-on state.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a structure of a single-poly non-volatile memory unit and the method of operation. In particular, the structure of a single-poly non-volatile memory unit of the present invention is completely compatible with the current semiconductor logic process of 90 nm or less and with the trend of miniaturization of the elements of the next generation.

The ONO stacking layers usually serve as the spacer in the semiconductor logic process of 0.18 µm or less for the reasons that first, using SiN as the material for the spacer is better than the use of $SiO_2$ in order to prevent the case that salicide is formed on the spacer to electrically connect the source/drain to cause element failure, and second, it is possible that the structure and the reliability of elements are sabotaged by the approach of contact holes of the source to the poly-Si to result in the contact holes going through the spacer due to the misalignment of the contact mask and the gate poly mask. The SiN layer may serve as an etching stopper if the etching selectivity of contact holes is high enough ($SiO_2$ to SiN). Therefore, for the semiconductor logic process of 0.18 µm or less, the ONO stacking layers may serve as the spacer.

Not only do the ONO stacking layers play an important role in the logic process, but they also form charge layers in the non-volatile memory. The conductivity of the channels is dependent on the quantity of charge in the ONO stacking layer to determine the "0" and "1" status. This is widely used in SONOS (Semiconductor-Oxide-Nitride-Oxide-Semiconductor) or MONOS (Metal-Oxide-Nitride-Oxide-Semiconductor) techniques. But, the ONO stacking layer is usually used in the gate dielectric in the non-volatile memory. So, it is not compatible with the regular logic process because of the additional ONO stacking layer. Therefore, it is very important to use spacers of the logic elements in the logic process as the charge trapping layers and further formation of novel non-volatile memory elements without additional photomasks.

Figure 1:
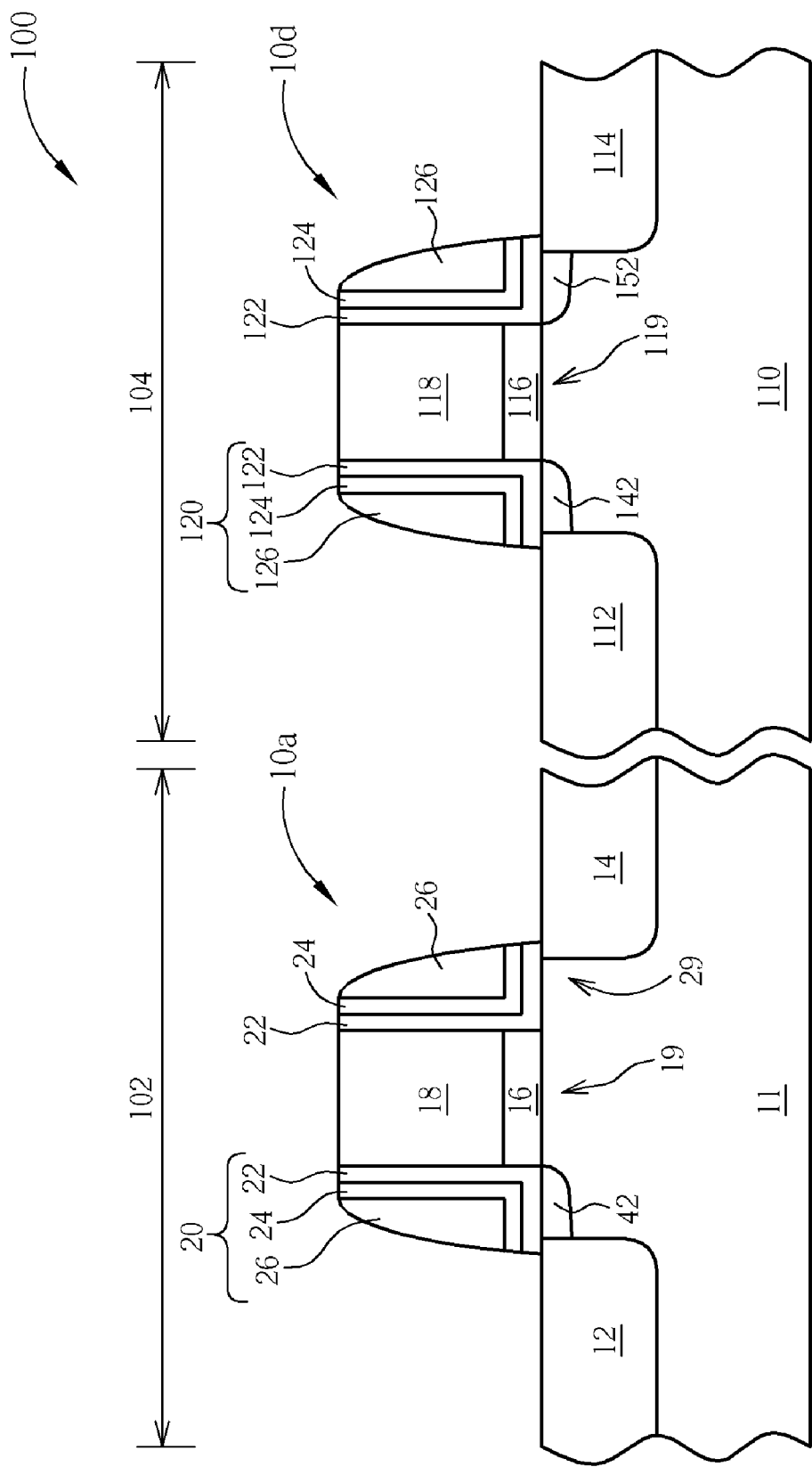
FIG. 1 illustrates a section view of the chip of the present invention. The single-poly non-volatile memory unit is embedded in the chip.

Please refer to FIG. 1. It illustrates a section view of chip 100. A single-poly non-volatile memory unit 10a is embedded in the chip 100 and has an asymmetric lightly doped drain (LDD). As shown in FIG. 1, the chip 100 comprises a memory array region 102 and a logic element region 104. At least a single-poly non-volatile memory unit 10a with the asymmetric lightly doped drain (LDD) is included in the memory array region 102. At least a logic element 10d is included in the logic element region 104. The logic element 10d is a transistor, which may be an NMOS transistor or a PMOS transistor.

The single-poly non-volatile memory unit 10a may be an NMOS or a PMOS. Take the NMOS for example, the single-poly non-volatile memory unit 10a comprises a P type well 11, a conductive gate 18 disposed on P type well 11, a dielectric gate 16 disposed between the conductive gate 18 and the P type well 11, an ONO spacer 20 disposed on the sidewall of conductive gate 18, an N+ source doping region 12 disposed in the P type well 11 on one side of the spacer 20, and an N+ drain doping region 14 disposed in the P type well 11 on one side of the spacer 20. An NLDD region 42 is directly under the ONO spacer 20 between the conductive gate 18 and the N+ source doping region 12 and there is no NLDD region under the ONO spacer 20 between the conductive gate 18 and the N+ drain doping region 14, which forms an asymmetric LDD doping. The region which is directly under the conductive gate 18 defines the first channel 19 (i.e. gate channel) and the region which is directly under the ONO spacer 20 between the conductive gate 18 and the N+ drain doping region 14 defines the second channel 29 (i.e. spacer channel).

The logic element 10d comprises a semiconductor substrate 110, a conductive gate 118 disposed on semiconductor substrate 110, a gate dielectric layer 116 disposed between the conductive gate 118 and the semiconductor substrate 110, an ONO spacer 120 disposed on the sidewalls of the conductive gate 118, a source doping region 112 disposed in the semiconductor substrate 110 on one side of the spacer 120 and a drain doping region 114 disposed in the semiconductor substrate 110 on one side of the spacer 120. The channel 119 is right under the conductive gate 118. Besides, an LDD region 142 is between the channel 119 and the source doping region 112 and an LDD region 152 is between the channel 119 and drain doping region 114, which forms a symmetric lightly doped configuration.

According to one preferred embodiment of the present invention, the ONO spacer 20 comprises a silicon oxide layer 22, a silicon nitride layer 24 and a silicon oxide layer 26, wherein the silicon oxide layer 22 with a thickness of 30-300 Å is disposed on the side walls of the conductive gate 18 and extends to the P type well 11. The silicon nitride layer 24 has a thickness of 50-500 Å and serves as a charge trapping layer for storing charges, such as electrons. The dielectric gate 16 is made of silicon dioxide. The conductive gate 18 may be made of doped poly-silicon but is not limited to this. Furthermore, a silicide (not shown) layer may be disposed on the conductive gate 18, the N+ source doping region 12 and the N+ drain doping region 14 to lower the contact resistance.

The core feature of the single-poly non-volatile memory unit 10a of the present invention lies in that electrons are trapped in the ONO spacer 20 on the side walls of the conductive gate 18. Besides, the single-poly non-volatile memory unit 10a of the present invention is asymmetric lightly doped drain doped configuration but not the symmetric lightly doped drain which prevents the short channel effect in logic elements, and has a double-channel of the gate channel 19 and the spacer channel 29. The present invention performs the programming and erasing of memory by controlling the threshold voltage ($V_{th}$) of the spacer channel 29.

Figure 2:
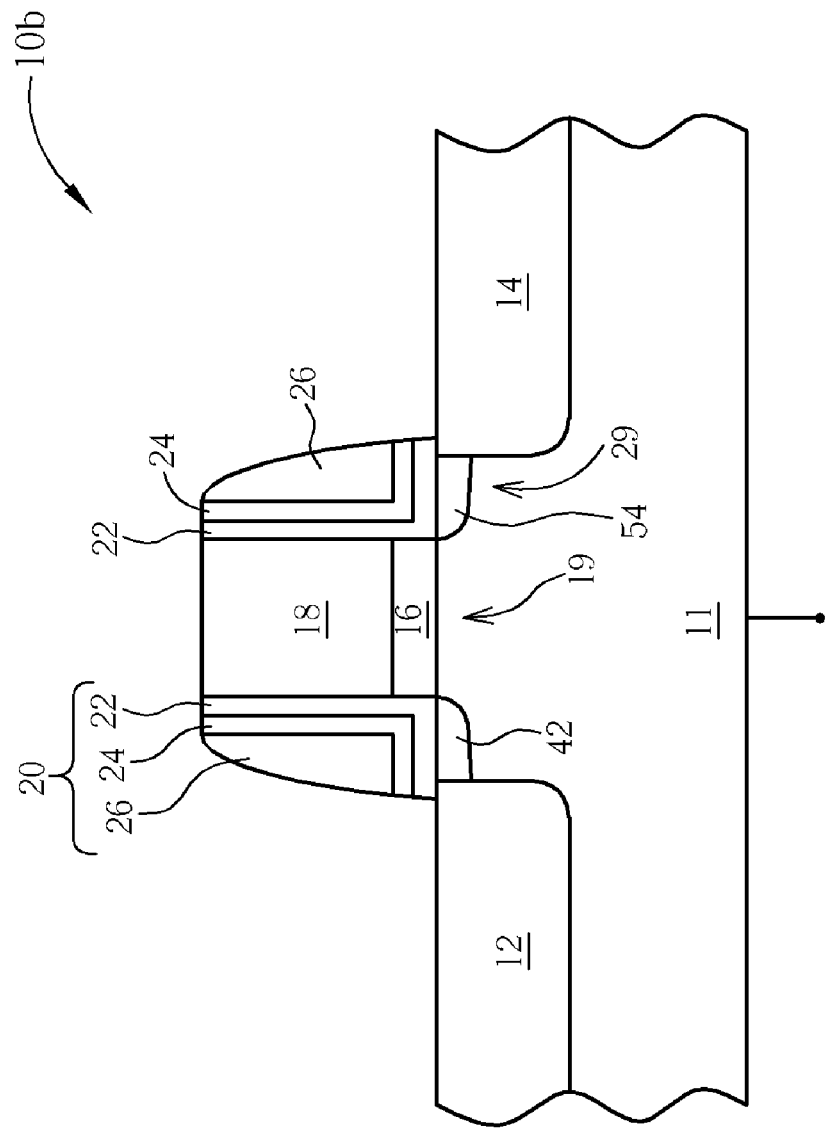
FIG. 2 illustrates a section view of the single-poly non-volatile memory unit of another preferred embodiment of the present invention.

In addition, the single-poly non-volatile memory unit 10a in FIG. 1 may be replaced by the single-poly non-volatile memory unit 10b in FIG. 2. Take NMOS shown in FIG. 2 for example, the single-poly non-volatile memory unit 10b comprises a P type well 11, a conductive gate 18 disposed on P type well 11, a dielectric gate 16 disposed between the conductive gate 18 and the P type well 11, an ONO spacer 20 disposed on the sidewalls of the conductive gate 18, an N+ source doping region 12 disposed in the P type well 11 on one side of spacer 20 and an N+ drain doping region 14 disposed in the P type well 11 on one side of the spacer 20. An NLDD region 42 is directly under the ONO spacer 20 between the conductive gate 18 and the N+ source doping region 12. Different from FIG. 1, there is a PLDD region 54 under the ONO spacer 20 between the conductive gate 18 and the N+ source doping region 14, which still forms an asymmetric LDD doping. Similarly, the first channel 19 is defined directly under the conductive gate 18 and the second channel 29 is defined directly under the ONO spacer 20 between the conductive gate 18 and the N+ drain doping region 14.

Now, FIG. 3 to FIG. 9 illustrate the detailed description of the operation of programming, erasing and reading of the single-poly non-volatile memory unit of the present invention. Please notice that the voltage profile in the following examples is for 0.13 μm process only. Persons skilled in the art understand that the voltage profile in the process of different generations may differ.

Figure 3:
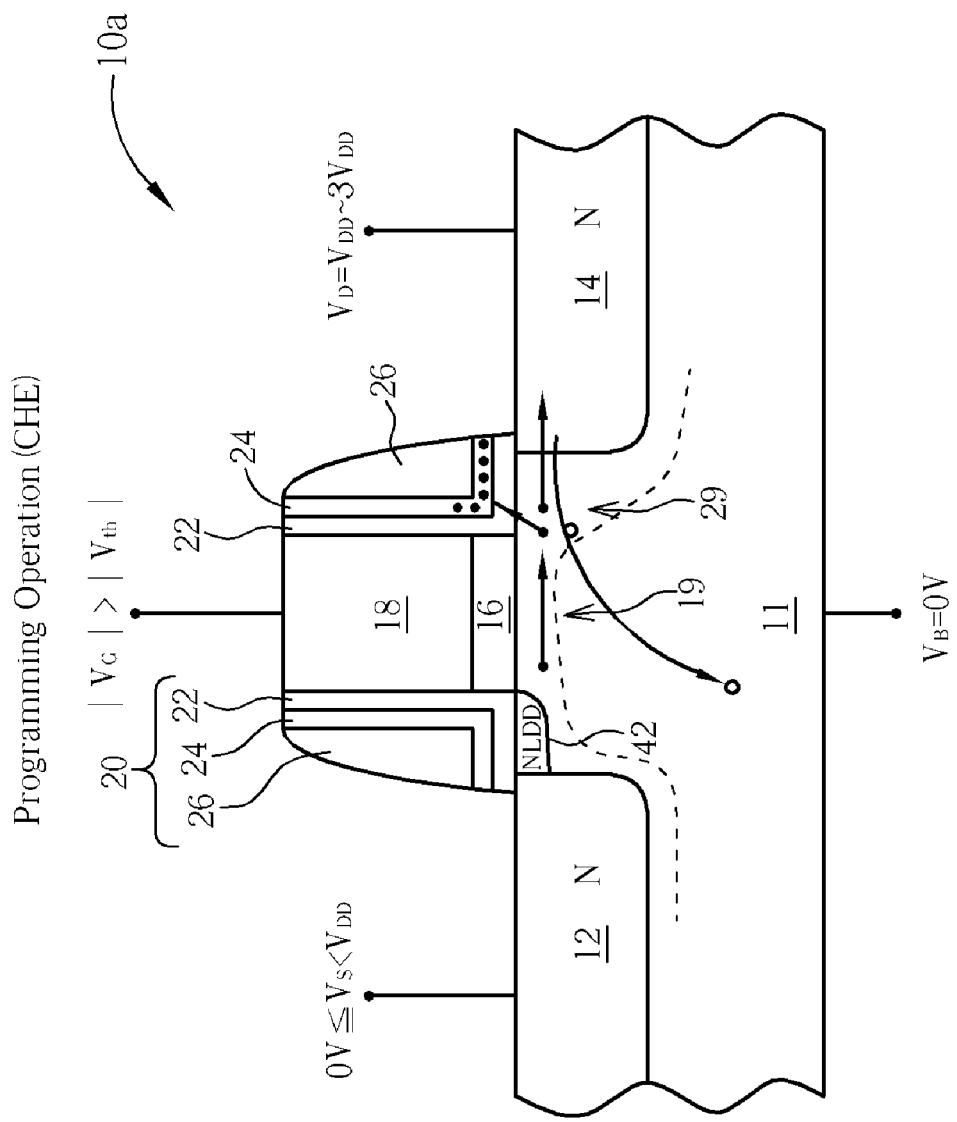
FIG. 3 and FIG. 4 illustrate a cross section view of the method for programming the single-poly non-volatile memory unit of the present invention.

Please refer to FIG. 3. FIG. 3 illustrates a cross section view of the method for programming the single-poly non-volatile memory unit of the present invention. When a single-poly non-volatile memory unit 10a is selected to perform writing or programming, the N+ drain doping region 14 (i.e. the bit line) is electrically connected to a positive drain voltage $V_D = V_{DD}$ to 3 $V_{DD}$ (the $V_{DD}$ is the standard voltage source applied on chips, 2.5V or 3.3V for example), such as VD=3V to 7V. N+ source doping region 12 (i.e. the source line) is grounded ($V_S = 0V$) or connected to a voltage between 0V to $V_{DD}$, $V_S = 0V$ to 1.5V for example, to provide a body effect. The P type well 11 is grounded and ($V_B = 0V$) and the conductive gate 18 (i.e. the word line) is electrically connected to a gate voltage $V_G$, wherein $|V_G| \geq |V_{th}|$. Take NMOS for example, $V_G = 3V$ to 7 V and take PMOS for example, $V_G = -1V$ to −7 V to render the first channel 19 under the conductive gate 18 in an open and strong inversion state. Under such operational condition, electrons are drawn into the first channel 19 from N+ source doping region 12 to generate "channel hot electrons" (CHEs) by impact ionization, and hot electrons are injected and trapped in the silicon nitride layer 24 in the spacer 20 near the N+ drain doping region 14.

Figure 4:
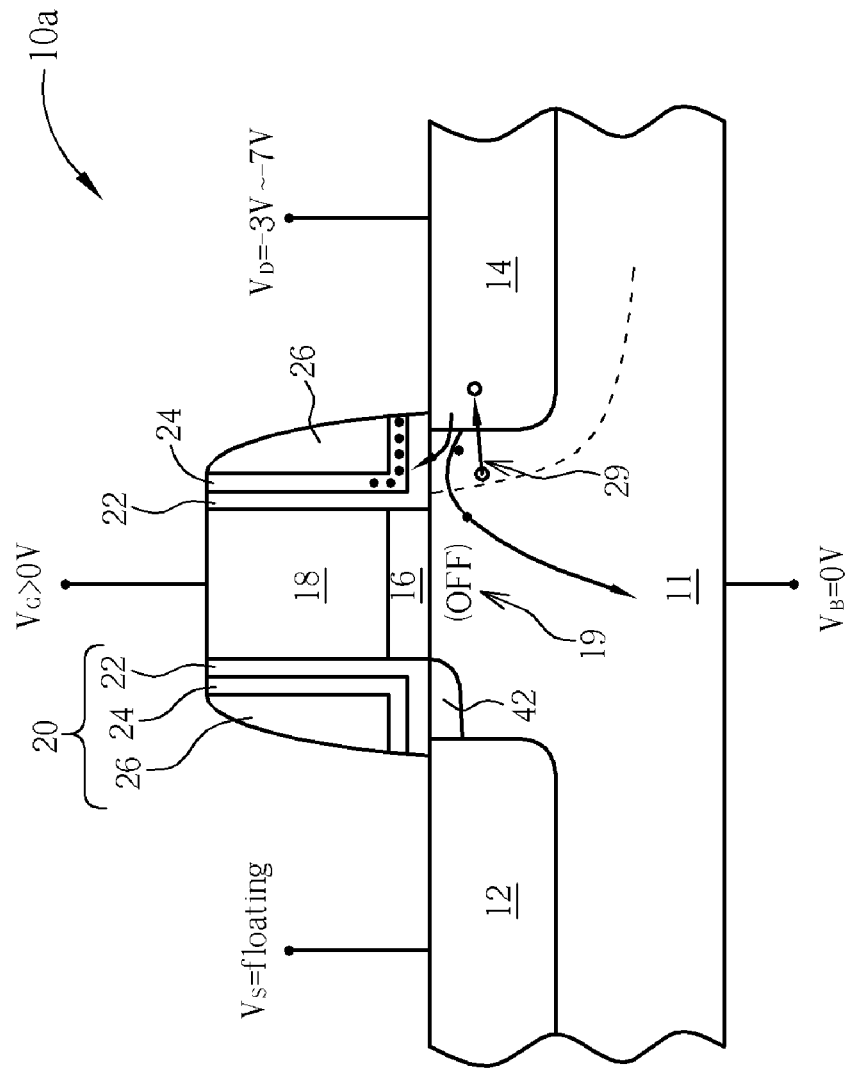

As shown in FIG. 4, if the single-poly non-volatile memory unit 10a is a PMOS, the programming operation may be performed by the band-to-band tunneling induced hot electrons (BBHEs). For example, P+ drain doping region 14 is electrically connected to a negative drain voltage $V_D$, −3V to −7V for example, and the P+ source doping region 12 is floating and the N type well 11 is grounded ($V_B = 0V$) but the conductive gate 18 is electrically connected to a positive gate voltage $V_G$, 1V to 5V for example, to turn off the first channel 19 (a P channel) under the conductive gate 18. Under such circumstance, hot electrons which are generated by the band-to-band induced hot electrons injection (BBHE) may be injected into the silicon nitride layer 24 of the ONO spacer 24 to complete programming operation.

Figure 5:
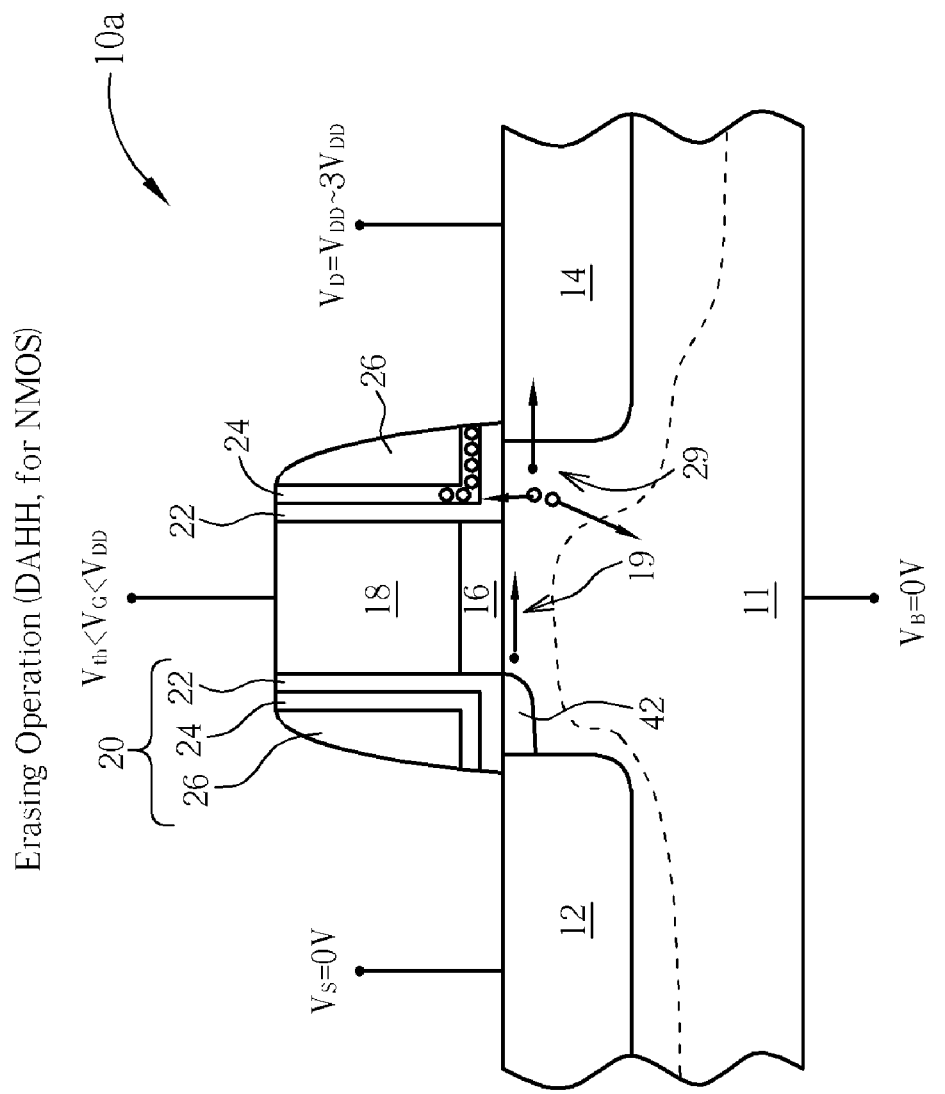
FIG. 5 to FIG. 7 illustrate a cross section view of the method for erasing the single-poly non-volatile memory unit of the present invention.
Figure 6:
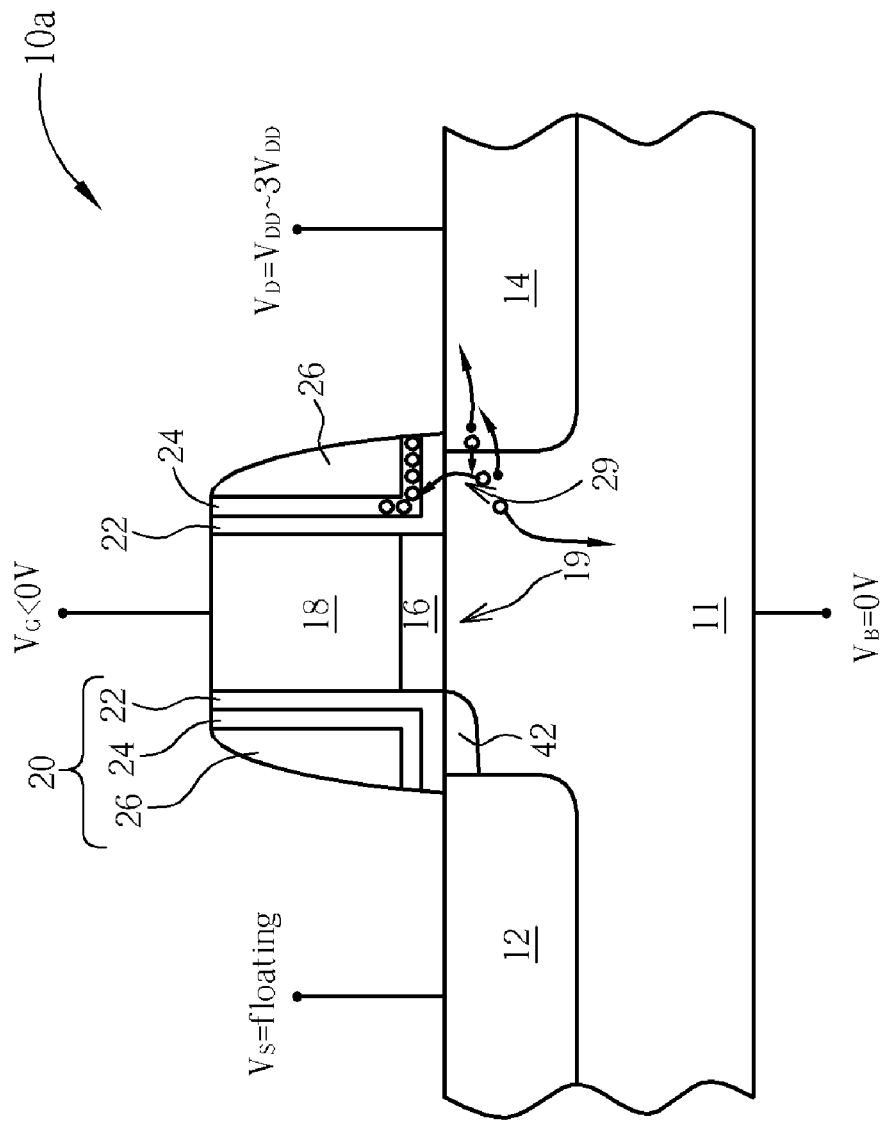
Figure 7:
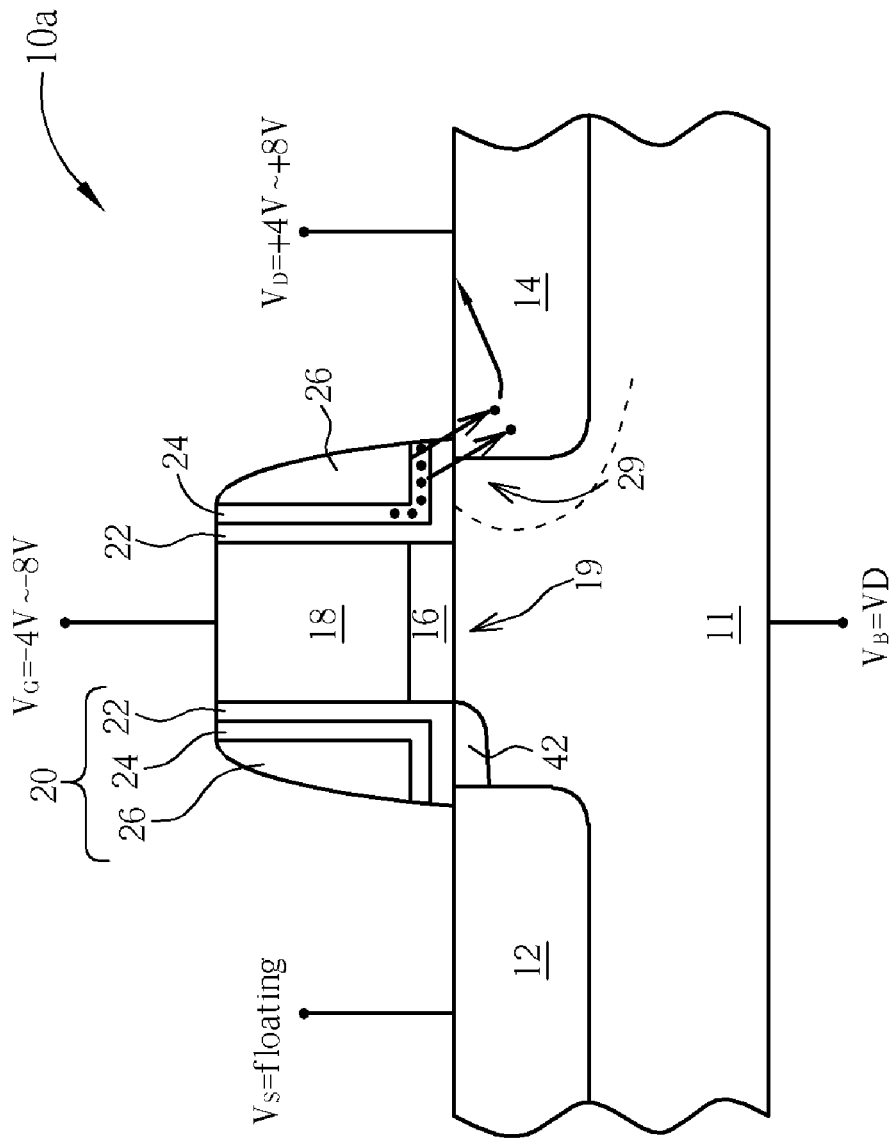

Please refer to FIG. 5 to FIG. 7, which illustrate a cross section view of the method for erasing the single-poly non-volatile memory unit of the present invention. FIG. 5 and FIG. 6 illustrate the situation when the single-poly non-volatile memory unit 10a is an NMOS and FIG. 7 illustrates the situation when single-poly non-volatile memory unit 10a is a PMOS. If the single-poly non-volatile memory unit 10 is for multi-purposes, it is electrically erasable.

Please refer to FIG. 5. According to one preferred embodiment of the present invention, when erasure is performed on the NMOS single-poly non-volatile memory unit 10a, the P+ drain doping region 14 is electrically connected to a positive drain voltage $V_D=V_{DD}$ to $3V_{DD}$ (for NMOS, $V_{DD}=2.5$ or 3.3V for example), $V_D=3V$ to 7V for example, and the P+ source doping region 12 and the N well 11 are grounded and the conductive gate 18 is electrically connected to a positive gate voltage $V_G$ which slightly but not strongly inverts the first channel 19. The appropriate voltage range is $V_{th}$ (for NMOS $V_{th}=0.5V$ for example) $<V_G<V_{DD}$ ($V_G=0.5–1.5V$ for example). Under such operational condition, the electrons which are trapped in the silicon nitride layer 24 of the ONO spacer 20 can be neutralized by the injection of the drain avalanche hot holes (DAHHs) to complete the erasing operation. The advantage of the method resides in that both $V_G$ and $V_D$ are positive for NMOS unlike the following example in which the band-to-band tunneling induced hot holes injection (BBHHs) requires that $V_G$ and $V_D$ are of different polarity, which eliminates any additional process and the possibility of triple well (or deep N-well) for the negative voltage isolation.

As shown in FIG. 6, according to another preferred embodiment of the present invention, the band-to-band tunneling induced hot holes(BBHHs) may be employed to erase the NMOS single-poly non-volatile memory unit 10a. The N+ drain doping region 14 is electrically connected to a positive drain voltage $V_D=V_{DD}$ to $3V_{DD}$, $V_D=3V$ to 7V for example, and the N+ source doping region 12 is floating ($V_S$=floating) and the N well 11 is grounded ($V_B=0V$) and the conductive gate 18 is electrically connected to a negative gate voltage $V_G$ ($V_G=-1$ to $-3V$ for example) to turn off the first channel 19. Under such circumstance electrons which are trapped in the silicon nitride layer 24 of the ONO spacer 20 can be neutralized by the injection of hot electric holes generated by the band-to-band induced hot hole injection (BBHH) to complete the erasing operation. The advantage of the method is energy savings because the erasing current is smaller (50 nA/µm).

As shown in FIG. 7, according to another preferred embodiment of the present invention, the Fowler-Nordheim tunneling (FN tunneling) may be employed to accomplish the erasure. For PMOS, the drain doping region 14 is electrically connected to a positive drain voltage $V_D$, $V_D=4V$ to 8V for example and the source doping region 12 is floating ($V_S$=floating) and the N well 11 is connected to a voltage the same as $V_D$ ($V_B=V_D$) and the conductive gate 18 is electrically connected to a negative gate voltage $V_G$ ($V_G=-4$ to $-8V$ for example). For NMOS, the drain doping region 14 is electrically connected to a higher and positive drain voltage $V_D$, $V_D=4V$ to 8V for example, and the source doping region 12 is floating ($V_S$=floating) and the N well 11 is connected to a voltage the same as $V_D$ ($V_B=V_D$) and the conductive gate 18 is electrically connected to a negative gate voltage $V_G$ ($V_G=-4$ to $-8V$ for example). Under such circumstance electrons which are trapped in the silicon nitride layer 24 of the ONO spacer 20 can be pulled out from the ONO spacer 20 by the FN tunneling.

Figure 8:
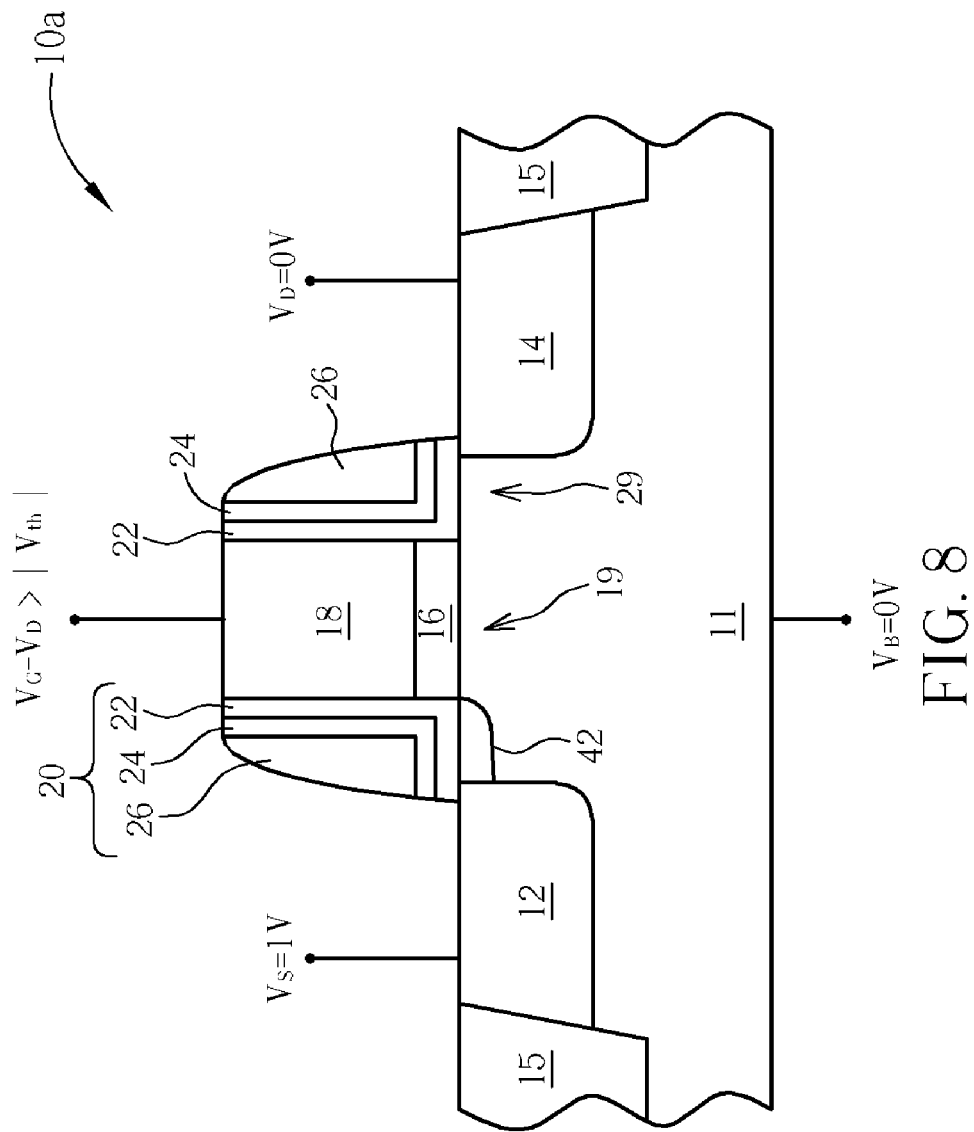
FIG. 8 to FIG. 9 illustrate a cross section view of the method for reading the single-poly non-volatile memory unit of the present invention.

Please refer to FIG. 8, which illustrates a cross section view of the method for reading the single-poly non-volatile memory unit of the present invention. Another feature of the present invention is the reverse read for reading operation, i.e., the drain is grounded and the source is applied a voltage not equal to 0. Take NMOS for example, for the reading operation of the single-poly non-volatile memory unit 10a the drain doping region 14 is grounded ($V_D=0V$) and the source doping region 12 is electrically connected to a positive $V_S$ ($V_S=1V$ for example) and the P well 11 is grounded ($V_B=0V$) and the conductive gate 18 is electrically connected to a positive voltage $V_G$ ($V_G=2.5V$ for example) and ($V_G-V_D$)>|$V_{th}$|.

For a more efficient reading operation, $V_D$ and $V_S$ may shift 0.5V simultaneously to generate the body effect. In other words, the drain doping region 14 is electrically connected to a positive voltage $V_D$, $V_D=0.5V$ and the source doping region 12 is electrically connected to a positive voltage $V_S$ ($V_S=1.5V$ for example) and the P well 11 is grounded ($V_B=0V$) and the conductive gate 18 is electrically connected to a positive voltage $V_G$ ($V_G=V_{DD}=2.5V$ for example). The turned-on state of the second channel 29 depends on if electrons are stored in the ONO spacer above the second channel 29. If no electrons stored, the second channel 29 lacks an inversion region and is not conductive. If electrons stored in the ONO spacer, the second channel 29 has an inversion region and is conductive.

Figure 9:
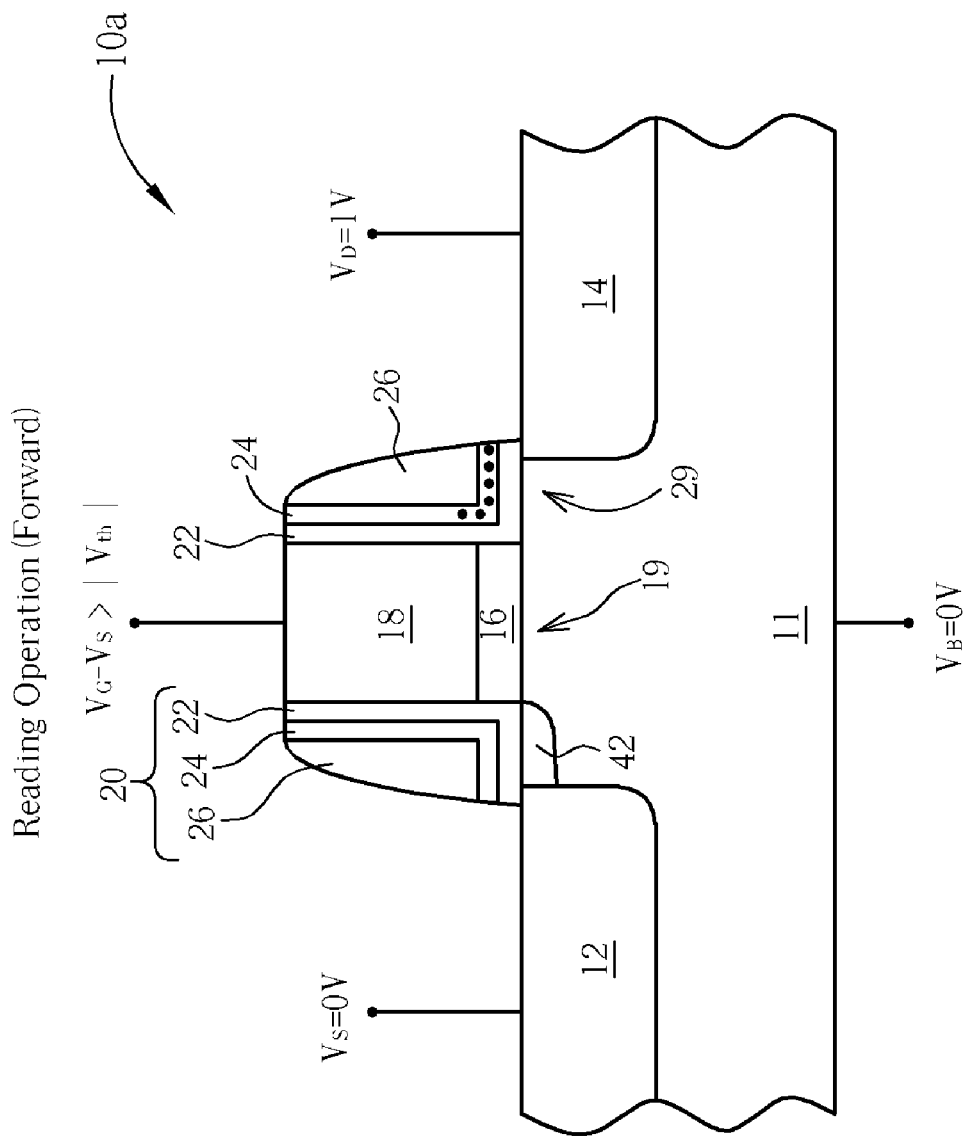

Please refer to FIG. 9, which illustrates a cross section view of the method for reading the single-poly non-volatile memory unit of the present invention. Forward read is also possible for the reading operation, i.e., the source is grounded and the drain is applied a voltage not equal to 0. Take NMOS for example, for the forward reading operation of the single-poly non-volatile memory unit 10a, the source doping region 12 is grounded ($V_S=0V$) and the drain doping region 14 is electrically connected to a positive $V_D$ ($V_D=1V$ for example) and the P well 11 is grounded ($V_B=0V$) and the conductive gate 18 is electrically connected to a positive voltage $V_G$ ($V_G=V_{DD}=2.5V$ for example) and ($V_G-V_S$)>|$V_{th}$|.

Figure 10:
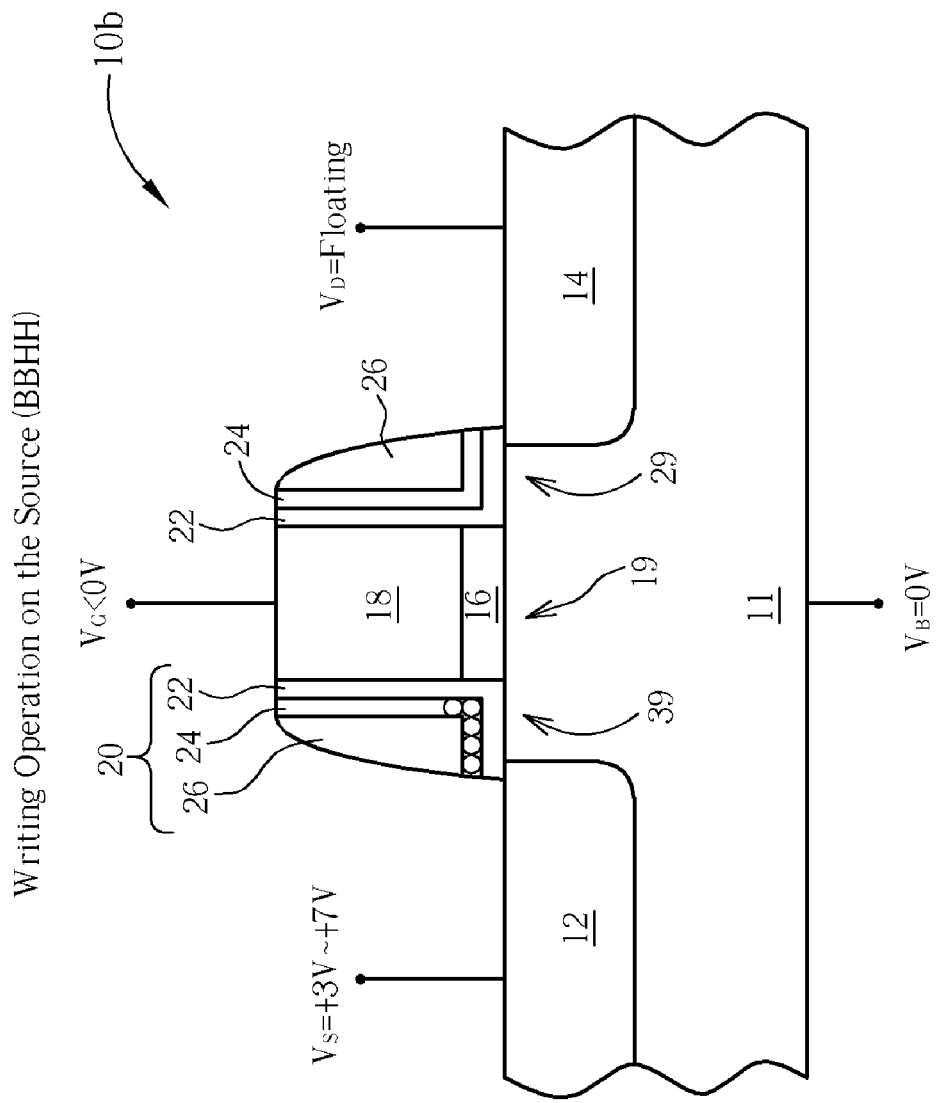
FIG. 10 illustrates a cross section view of the method for writing the source of the NMOS single-poly non-volatile memory unit of another preferred embodiment of the present invention.

Please refer to FIG. 10, which illustrates a cross section view of the method for writing the source of the NMOS single-poly non-volatile memory unit 10b of another preferred embodiment of the present invention. Structurally, the NMOS single-poly non-volatile memory unit 10b lacks the LDD on both sides. Considering there is no LDD in the source, the third channel 39 in the source should be first conductive. During the test of the chips (before the delivery), a pre-writing operation is performed on the source for all the single-poly non-volatile memory units 10b in the memory array. Electric holes are injected into the silicon nitride layer 24 of ONO spacer 20 above the third channel 39 by the band-to-band tunneling induced hot holes (BBHHs) in advance to function as an NLDD. Afterwards, all the programming and erasing operations of the non-volatile memory are performed on the drain 29, such as the programming operation of the drain avalanche hot holes (DAHHs) of the preferred embodiment in FIG. 5 and the band-to-band tunneling induced hot electrons (BBHEs) of the preferred embodiment in FIG. 6, or the erasing operation of FN tunneling of the preferred embodiment in FIG. 7. According to the preferred embodiment, for the pre-programming operation of the NMOS single-poly non-volatile memory unit 10b the N+ source doping region 12 is electrically connected to a source voltage $V_S$, $V_S=+3$ to $+7V$ for example, and the N+ drain doping region 14 is floating ($V_D$=floating) and the substrate 11 is grounded ($V_B=0V$) and the conductive gate 18 is electrically connected to a negative voltage $V_G$ ($V_G=-2.5$ to $-3.3V$ for example). After electric holes are injected into the spacer above the source to render the third channel conductive, the ultimate turned-on state during a reading operation of the non-volatile memory element depends on if a programming operation was performed on the ONO spacer above the second channel 29 so as to change an on-off state of the second channel 29 region.

To sum up, the advantages of the present invention include:

(1) The memory structure of the present invention is completely compatible with the semiconductor process of the nano-scale because on the side walls of the gate the semiconductor elements under the nano-scale all employ ONO spacers;

(2) the cost is economic because no additional photo mask is needed;

(3) it is useful in both MTP memories and OTP memories;

(4) it has very small memory unit size; and (5) it may have the possibility to achieve the twin bits per transistor storage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for programming a single-poly non-volatile memory unit, said single-poly non-volatile memory unit comprising an ion well of a first conductivity type, a source doping region of a second conductivity type, a drain doping region of said second conductivity type and a channel region between said source doping region and said drain doping region, wherein said channel region is divided into a first channel region and a second channel region connected to said first channel region with the same polarity, and said first channel region has a threshold voltage (Vth), a gate dielectric layer disposed directly above said first channel region, a control gate stacked on said gate dielectric layer, a dielectric spacer on a sidewall of said control gate and directly above said second channel region, wherein said dielectric spacer comprises a charge trapping dielectric medium; and an asymmetric lightly doped drain (LDD) region of said second conductivity type disposed merely between said control gate and said source doping region, said method comprising:

connecting said ion well to a well voltage (VB);

electrically connecting said drain doping region to a drain voltage (VD) to form a reverse bias at a junction between said drain doping region and said ion well;

electrically connecting said source doping region to a source voltage (VS); and electrically connecting said control gate to a gate voltage (VG) to render said first channel in an open and strong inversion state, wherein carriers are drawn into said first channel from said source doping region to generate channel hot electrons (CHEs), and more hot electrons are generated due to ion impact ionization and said hot electrons are re-directed, injected and trapped in said charge trapping dielectric medium due to a vertical electric field generated by said gate voltage (VG).

2. The method according to claim 1, wherein said dielectric spacer is an ONO-type spacer, and said ONO-type spacer comprises silicon oxide and silicon nitride, and wherein said charge trapping dielectric medium is a silicon nitride layer.

3. The method according to claim 1, wherein there is no LDD region of said second conductivity type between said control gate and said drain doping region.

4. The method according to claim 1, wherein if said first conductivity type is P type, said second conductivity type is N type, and wherein if said first conductivity type is N type, said second conductivity type is P type.

5. The method according to claim 1, wherein if said channel region is N channel, said VD is between 3V to 7V, and if said channel region is P channel, said VD is between −3V to −7V.

6. A method for programming a single-poly non-volatile memory unit, said single-poly non-volatile memory unit comprising an ion well of a first conductivity type, a source doping region of a second conductivity type, a drain doping region of said second conductivity type and a channel region between said source doping region and said drain doping region, wherein said channel region is divided into a first channel region and a second channel region connected to said first channel region with the same polarity, and said first channel region has a threshold voltage (Vth), a gate dielectric layer disposed directly above said first channel region, a control gate stacked on said gate dielectric layer, a dielectric spacer on a sidewall of said control gate and directly above said second channel region, wherein said dielectric spacer comprises a charge trapping dielectric medium; a first lightly doped drain (LDD) region of said second conductivity type between said control gate and said source doping region, and a second LDD region of said first conductivity type opposite to said second conductivity type between said control gate and said drain doping region, said method comprising:

connecting said ion well to a well voltage (YB);

electrically connecting said drain doping region to a drain voltage (VD) to form a reverse bias at a junction between said drain doping region and said ion well;

electrically connecting said source doping region to a source voltage (VS); and electrically connecting said control gate to a gate voltage (VG) to render said first channel in an open and strong inversion state, wherein carriers are drawn into said first channel from said source doping region to generate channel hot electrons (CHEs), and more hot electrons are generated due to ion impact ionization and said hot electrons are re-directed, injected and trapped in said charge trapping dielectric medium due to a vertical electric field generated by said gate voltage (VG).

7. The method according to claim 6, wherein said dielectric spacer is an ONO-type spacer, and said ONO-type spacer comprises silicon oxide and silicon nitride, and wherein said charge trapping dielectric medium is a silicon nitride layer.

8. The method according to claim 6, wherein if said channel region is N channel, said VD is between 3V to 7V, and if said channel region is P channel, said VD is between −3V to −7V.

* * * * *